United States Patent [19]

Peters et al.

[11] Patent Number: 4,466,119
[45] Date of Patent: Aug. 14, 1984

[54] AUDIO LOUDNESS CONTROL SYSTEM

[75] Inventors: Richard W. Peters, Algonquin; Martin Dippel, Chicago, both of Ill.

[73] Assignee: Industrial Research Products, Inc., Elk Grove Village, Ill.

[21] Appl. No.: 469,202

[22] Filed: Apr. 11, 1983

[51] Int. Cl.³ .............................................. H03G 3/20
[52] U.S. Cl. ..................................... 381/108; 381/106; 330/136; 330/279; 333/14
[58] Field of Search ................. 381/102, 103, 106–108, 381/120, 121; 333/14, 28 T; 330/129, 136, 138, 279, 280, 281; 455/234, 235, 239, 245, 246, 247, 72, 233

[56] References Cited

U.S. PATENT DOCUMENTS

| 3,582,964 | 6/1971 | Torick et al. | 381/103 |
| 3,918,003 | 11/1975 | Seidel | 330/136 X |
| 4,281,295 | 7/1981 | Nishimura et al. | 333/14 |
| 4,406,923 | 9/1983 | Burne et al. | 381/108 |

Primary Examiner—A. D. Pellinen
Assistant Examiner—W. J. Brady
Attorney, Agent, or Firm—Kinzer, Plyer, Dorn & McEachran

[57] ABSTRACT

An audio loudness control system for processing a broad dynamic range of audio input signals (e.g. 70 to 100 dB) comprises a gain-controlled amplifier, a feed forward control signal generator having an audio signal input that develops a feed forward gain control signal having an amplitude representative of long-term input excursions of the audio signal above a predetermined loudness threshold, a feedback control signal generator having an input from the audio output of the amplifier that develops a feedback gain control signal having an amplitude representative of transient output signal excursions above the loudness threshold, and a selector gate that selects the gain control signal of instantaneously higher effective magnitude and applies the selected gain control signal to the gain control input of the amplifier.

21 Claims, 4 Drawing Figures

AUDIO LOUDNESS CONTROL SYSTEM

BACKGROUND OF THE INVENTION

High quality audio signals, such as those generated in the course of many live musical performances or those produced on playback from carefully processed and recorded material, may have a dynamic range of as much as one hundred decibels. A dynamic range of 100 dB constitutes a difference of 100 dB between the quietest sounds discernible and the loudest undistorted sounds represented by the signal. Another instance of a broad dynamic range occurs in the case of sound reinforcement microphones, which are required to handle a dynamic range within the limitations imposed by room background noise and by loud talking in close proximity to the microphones. Here, the dynamic range may exceed 90 dB at the microphone.

Preservation of the full dynamic range for a given audio source, whether in radio broadcasting, in operation of a sound reinforcement system, or in a residential or commercial playback system, is not always desirable and frequently is inordinately expensive. For such situations, compression/limiter amplifiers have been used to develop an audio signal having a restricted dynamic range from an input signal with a substantially broader dynamic range. Thus, broadcast radio stations have used compression/limiter amplifiers to increase the average level of the signal received by listeners. Low level signals in the source material are amplified enough to be heard even if the listener is in a high background noise environment. The compression/limiter amplifier prevents high level signals in the source material from over-modulating the transmitter. Similarly, sound reinforcement systems ideally should compensate for level variations among talkers and for variations in microphone talking distances by providing a more constant and comfortable level in the loudness of the sound reproduced for listeners. A compression/limiter amplifier, adjusted in threshold level, can provide full gain for soft talkers while at the same time reducing the gain for loud talkers.

Another application for compression/limiter amplifiers in audio systems pertains to consumer records and tapes. The dynamic range for a record or a tape is limited by the noise and distortion characterics of the recording medium. A compression/limiter amplifier can be used to restrict the dynamic range prior to recording. In this way, low level sounds are amplified above the recording noise and high amplitude inputs are limited to levels below the recording distortion level.

The reduced dynamic range for the output of a compression/limiter amplifier results in low level signals not falling as low as before the amplifer and high level signals not being as high as before the amplifier. The key to effective design of a useful audio system utilizing a compression/limiter amplifier is to provide a dynamic range restriction having the least audible side effects.

Two different forms of audio systems using compressor/limiter amplifiers have been most commonly employed. In a feed forward compressor/limiter amplifier system, it is customary to employ a voltage-controlled amplifier having a gain characteristic that decreases with increasing DC voltage on its control input. The gain control circuit for an amplifier of this kind converts an incoming audio signal to a DC level proportional to the incoming signal amplitude. This gain control voltage is fed forward to the voltage controlled amplifier so that if the audio signal input decreases in level, the amplifier gain increases. If the audio input signal increases in level, a control signal of greater amplitude is supplied to the voltage-controlled amplifier and the gain is reduced. Consequently, the output level tends to remain constant despite changes in input level. The other commonly employed compression/limiter amplifier circuit is a feedback control. In this type of system, increases in output level from the voltage controlled amplifier increase the feedback control voltage and reduce the amplifier gain, thereby decreasing the output level.

To achieve a flat limiting response in a compression/limiter amplifier of the feedback type, a high gain must be incorporated in the feedback control loop. Consequently, after a transient level change, a feedback limiter amplifier approaches final value in an oscillatory manner that is undesirable for a high quality audio system. A feed forward compression/limiter amplifier, on the other hand, is free of control loop feedback, and hence can provide limiter action without oscillation or "hunting", but a controlled "mild" compression characteristic (e.g. 2:1 compression) is difficult to achieve. Conversely, a feedback compression/limiter amplifier is usually stable for a mild compression characteristic with only limited gain in the feedback loop.

Some attempts have been made to combine the feed forward and feedback controls in a compression/limiter amplifier, but the results have been generally unsatisfactory. These combination circuits have been based upon a summation of the control signal outputs from the feed forward and feedback controls and the result tends to erratic operation of the gain level in the controlled amplifier.

SUMMARY OF THE INVENTION

It is a principal object of the present invention, therefore, to provide a new and improved loudness control system using a gain-controlled audio amplifier of the compression/limiter type that retains the principal operating advantages of previously known feed forward and feedback controls in a unified circuit.

A specific object of the invention is to provide a new and improved audio loudness control system that combines the flat limiting characteristic and stable gain control of a feed forward compression/limiter amplifier with the easily implemented mild compression action of a feedback type compression/limiter amplifier.

Another object of the invention is to provide a new and improved audio loudness control system, using a compression/limiter amplifier, that incorporates a feed forward gain control circuit that eliminates adverse effects of transient feed signals and which provides for rapid update without needless "hunting" of the control voltage so that a subjectively smooth gain control action is afforded.

Accordingly, the invention relates to an audio loudness control system for use with a broad dynamic range of audio input signals, comprising a gain-controlled audio amplifier having an audio signal input, a gain control input, and an audio signal output, feed forward control signal generator means, having an input coupled to the audio signal input of the amplifier, for generating a feed forward control signal representative of excursions of the average audio input signal above a predetermined loudness threshold, feedback control signal generator means, having an input coupled to the audio signal output of the amplifier, for generating a feedback control signal representative of transient excursions of the audio output signal above the predetermined loudness threshold, and selector gate means, having inputs coupled to the feed forward and feedback control signal generator means and an output coupled to the gain control input of the amplifier, for selecting the control signal instantaneously representative of the larger excursion above the loudness threshold and applying the selected control signal to the gain control input of the amplifier.

DESCRIPTION OF THE PREFERRED EMBODIMENTS

Figures 1, 2:
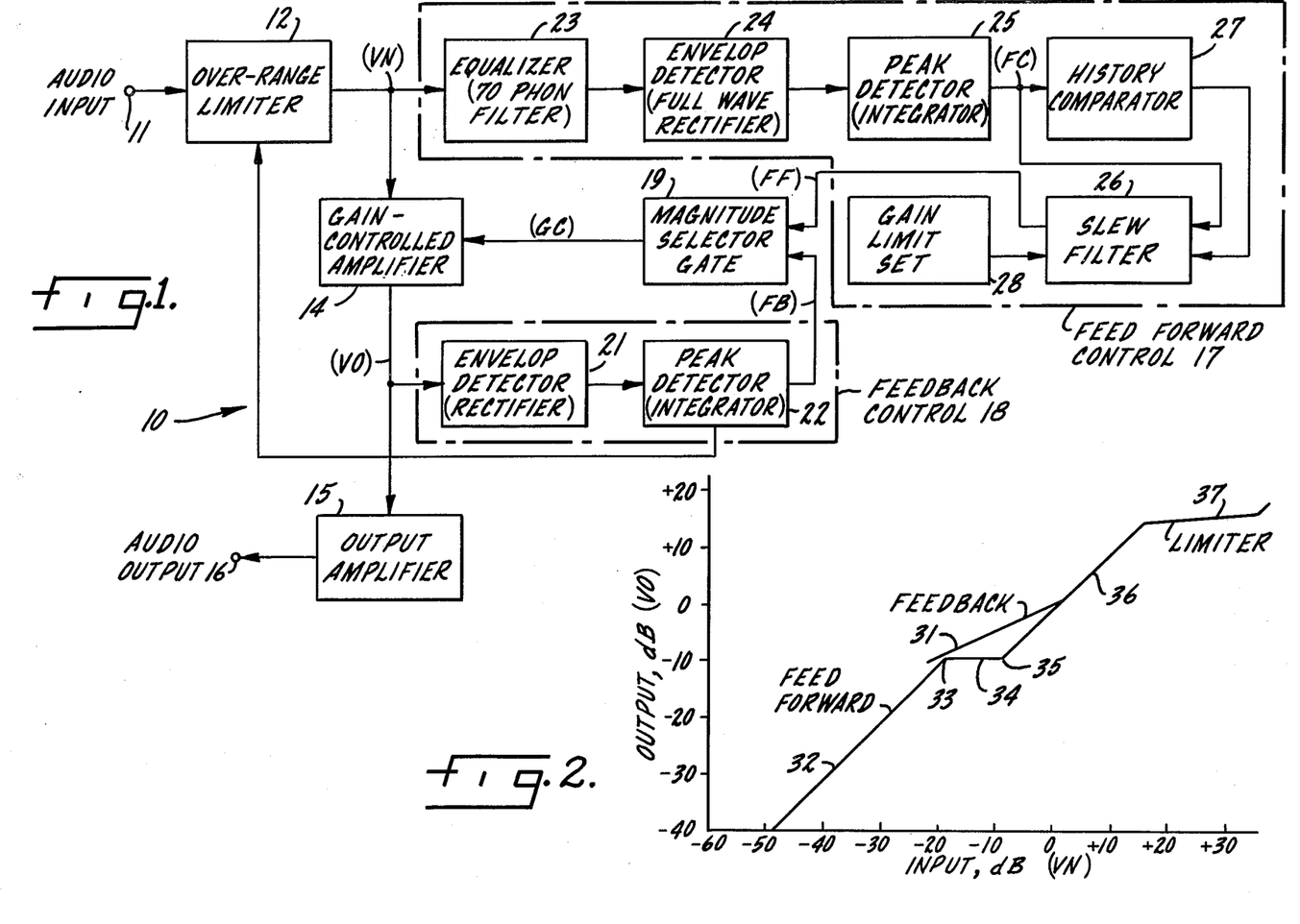
FIG. 1 is a block diagram of a preferred form of an audio loudness control system constructed in accordance with the present invention.
FIG. 2 is a generalized illustration of certain operating characteristics of the audio loudness control system of the invention.

The audio loudness control system 10 illustrated in the block diagram of FIG. 1 has an audio input terminal 11 connected to an over-range limiter circuit 12. The output VN of limiter circuit 12 is supplied to a gain-controlled amplifier 14. The output VO of amplifier 14 is connected to an output amplifier 15 in turn connected to the audio output terminal 16 of the loudness control system 10.

Loudness control system 10, FIG. 1, further comprises a feed forward control signal generator 17 and a feedback control signal generator 18. The feed forward control 17 generates a feed forward control signal that is representative of excursions of the average audio input signal above a predetermined loudness threshold, based on an input to control 17 of the audio input signal VN from limiter 12, the same signal that is supplied to the gain-controlled amplifier 14. The feed forward control signal output FF from control 17 constitutes one input to a magnitude selector gate 19. Feedback control 18, on the other hand, which has an input comprising the audio output signal VO from amplifier 14, generates a feedback control signal FB representative of transient excursions of the audio signal VO above the predetermined loudness threshold. That feedback control signal FB is also supplied as an input to selector gate 19. Gate 19 selects the control signal input that is instantaneously representative of the larger excursion above the loudness threshold and supplies the selected control signal GC to the gain control input of amplifier 14.

Feedback control 18 is a relatively simple circuit of a kind often used in compression/limiter amplifiers of the feedback type. It may include an envelope detector 21, usually a full wave rectifier, and a peak detector (integrator) or integrator circuit 22. The output of detector 22 is the feedback control signal FB.

The feed forward control 17 is more complex. Thus, the feed forward control 17, starting at its input, may comprise an equalizer circuit 23 that weights incoming signal strength in accordance with an approximation of the frequency sensitivity of the human ear, preferably at the seventy phon loudness level. The output of equalizer 23 is supplied to an envelope detector 24, usually a full wave rectifier, followed by a peak detector 25. Detector 25 should have an attack time that is substantially shorter than its release time to simulate the loudness growth and decay characteristics of the human ear. For example, the attack time of peak detector 25 may be approximately one hundred milliseconds and the release time about five hundred milliseconds. Thus, the output signal FC from peak detector 25 is a loudness signal that exhibits frequency and time characteristics generally corresponding to the selective loudness values of the audio input signal VN.

The loudness signal FC from peak detector 25 is supplied as an input to a slew filter 26 and to a history comparator circuit 27. Slew filter 26 also has an input derived from the history comparator 27 and another input derived from a gain limit set circuit 28. The output of filter 26 is the feed forward control signal FF.

In considering the operation of loudness control system 10, it is convenient to start with the assumption that the system has been energized but that there is no initial audio input signal at terminal 11. In these circumstances, of course, the audio input VN to amplifier 14 is effectively zero and so is its output signal VO. With no available signal to detect, the feedback gain control signal FB from feedback control 18 is zero. Similarly, with no input signal VN, feed forward control 17 does not generate a loudness signal FC at the output of the equalizer and detector circuits 23-25 constituting the initial stages of feed forward control 17. For these conditions, the output of slew filter 26, the feed forward gain control signal FF, is maintained within a predetermined range established by the gain limit set circuit 28. Gate 19 selects the feed forward gain control signal FF and supplies that as the control signal GC to amplifier 14. Of course, with no output VO from amplifier 14, there is no output signal at terminal 16.

It may next be assumed that an audio input signal within the normal dynamic range of system 10 is applied to terminal 11. This signal may be originated by someone speaking into a microphone, by pickup from a live musical performance, or from virtually any other source. This audio input passes through limiter 12, which has no substantial effect, and appears as the input signal VN to amplifier 14 and feed forward control 17. As previously noted, the feed forward control is an averaging device having its operation based upon relatively long-term effects; consequently, the feed forward gain control signal FF does not change immediately following initiation of an audio input to system 10. If signal VN is low enough so that the output signal VO from amplifier 14 is below the system threshold (set by circuit 28) the gain of amplifier 14 remains unchanged.

On the other hand, if the input signal VN has a sufficient amplitude so that the output signal VO from amplifier 14 exceeds the system threshold loudness level, the feedback gain control signal FB developed by feedback control 18 exceeds the effective amplitude of the feed forward gain control signal FF and hence is selected by gate 19 and supplied as the gain control signal GC to amplifier 14. Thus, on start-up, feedback control 18 may control the gain of amplifier 14 for a limited interval, determined by the averaging time for the feed forward control 17, with system 10 initially functioning as a compression/limiter amplifier of the feedback type.

Assuming that the audio input signal at terminal 11 extends in duration for an appreciable time, the feed forward gain control signal FF assumes a significant role in control of system 10. Thus, the audio input signal VN is weighted, in equalizer circuit 23, which constitutes a seventy phon filter, producing an equalized audio signal, supplied to detector 24, having an amplitude corresponding to the frequency sensitivity of the human ear. This assures that the control voltage FF ultimately developed by the feed forward control 17 reacts in proportion to the loudness value of the incoming signal rather than simply to its overall amplitude.

The equalized audio output signal from filter 23 is envelope detected in circuit 24, producing a DC envelope level signal having an amplitude proportional to loudness of the audio input. This envelope level signal is further detected in peak detector 25 to develop the loudness signal FC. As previously noted, peak detector 25 preferably has a relatively short attack time, approximately one hundred milliseconds, and a substantially longer release time, about five hundred milliseconds, to simulate the loudness growth and decay characteristics of the human ear. Accordingly, the loudness signal FC exhibits the frequency and time characteristics of the subjective loudness level of the audio input.

The loudness signal FC is supplied as an input to filter 26; any increase or decrease in the loudness signal FC tends to cause a corresponding increase or decrease in the output signal FF from the slew filter. Slew filter 26, however, controls the slew rate for its output signal FF in accordance with a predetermined rate of change characteristic. Moreover, operation of the slew filter is controlled so that its output FF is maintained within predetermined limits established by gain limit set circuit 28. In the preferred construction described more fully hereinafter in connection with FIGS. 3 and 4, slew filter 26 is constructed to enforce a logarithmic rate of change on its output signal FF relative to changes dictated by the input signal FC. By maintaining a logarithmic rate of change characteristic in the operation of slew filter 26, feed forward control 17 is effective to eliminate needless "hunting" in its output signal FF, the feed forward gain control signal, and affords a subjective smooth gain control in the operation of amplifier 14 because the human ear responds logarithmically to loudness changes. Slew filter 26 also acts to smooth out transient fluctuations of the loudness signal FC in the generation of gain control signal FF.

In the operation of feed forward control 17, it is desirable to prevent small "noise" in the audio input signal VN, unrelated to actual audio or program information, from affecting the gain control signal FF that is the output of slew filter 26. It is also desirable to limit the operation of feed forward control 17 so that it functions as an averaging control; that is, transient excursions of the audio input signal VN are better left to the control of feedback control 18. These purposes are served by history comparator circuit 27, which effectively blocks the operation of slew filter 26 to prevent change in its output signal FF for small noise and transient low amplitude excursions occurring in the audio input signal VN. Comparator 27 has a further effect on the operation of slew filter 26 and its feed forward gain control output signal FF, once system operation is carried forward for an appreciable interval (e.g., more than one second). Thus, if the audio input signal VN is interrupted for a relatively brief period, as when a pause occurs in a live pickup from one or more microphones or when the music stops in a pickup from a musical performance, comparator 27 effectively blocks the operation of slew filter 26 and prevents an undesirable change in the level of the feedback gain control signal FF.

Once the initial brief period of actual feedback control as described above has transpired, the gain control signal GC supplied to amplifier 14 from gate 19 is that input signal, either the feed forward gain control signal FF or the feedback control signal FB, having the greater amplitude. In general, for most audio input signal variations, the control is exercised by feed forward control 17 and its output signal FF. For any high level audio excursions of relatively transient nature, however, gain control reverts to feedback control circuit 18 and its output signal FB. Because feedback control 18 is utilized to control transient output level changes, the equalization applied to the feed forward control by circuit 23 is not used. This permits feedback control 18 to control the gain of amplifier 14 in a manner that prevents system overload for frequencies not normally within the range of sensitivity of the human ear, as may result from microphone handling noise in some audio systems.

In practical applications of loudness control system 10, the total change of gain provided for amplifier 14 is limited such that for low audio signal levels a maximum gain limit is set and for high signal levels a minimum gain level is set. Thus, a threshold must be exceeded before the gain of amplifier 14 is reduced through operation of either feed forward control 17 or feedback control 18. The system thresholds are determined by gain limit set circuit 28. In the preferred system 10, as shown in FIG. 1, over-range limiter 12 is provided with a feedback connection from detector 22 in feedback control 18 to prevent overload of the system from excessively high level inputs that might occur at terminal 11.

Some of the generalized operating characteristics of audio loudness control system 10 are illustrated in FIG. 2. As shown therein, the feedback control characteristic, line 31, corresponds to a relatively "mild" compression control at a ratio of approximately 2:1. The feed forward control charcteristic begins with line 32, determined by the higher gain threshold established by gain limit circuit 28, with no appreciable change in the gain of amplifier 14 until point 33. At point 33, the input loudness level exceeds the lower threshold set by circuit 28; for the next portion 34 of the feed forward control characteristic, the system functions as a flat limiter, with no increase of output loudness despite an appreciable increase of input loudness. The signal range indicated by portion 34 of the feed forward control characteristic ends at point 35. The input loudness range between points 34 and 35 may, for example, be of the order of ten dB. From point 35 on, the feed forward control characteristic continues with a segment 36 that has the same slope as the initial segment 32 but has been displaced for an effective reduction in loudness of the output signal relative to the input. Segment 36 of the control characteristic ends at a point determined by the operational characteristic of over-range limiter 12, which produces the final segment 37 of the operating characteristic for the overall system.

From the foregoing description of FIGS. 1 and 2, it is seen that audio loudness control system 10 utilizes the flat limiting and stable gain characteristics afforded by feed forward amplifier gain control in combination with the easily implemented mild compression action of a feedback control. Thus, in system 10, the feedback control exercised by circuit 18 and exemplified by curve 31 corresponds to a relatively mild compression action at a ratio of about 2:1. Of course, this ratio can be varied in dependence upon the circuit parameters and operating characteristics utilized for detectors 21 and 22 in feedback control 18. The flat limiting characteristic of a feed forward compression/limiter amplifier, exemplified by portion 34 of the feed forward operating characteristic, is also provided by system 10. The two gain control signals FF and FB are selected on the basis of magnitude by gate 19 and only one of them is supplied as the gain control signal GC to amplifier 14. This avoids the erratic operating characteristics of arrangements in which feed forward and feedback gain control signals are summed or otherwise combined for use as gain control signals, an arrangement that almost inevitably leads to over-control with too frequent and excessive swings in the gain of amplifier 14. Stated differently, the audio loudness control system 10, unlike previously known systems that combine feedback and feed forward control voltages, switches control between the two without disturbing the value of either.

Figure 3:
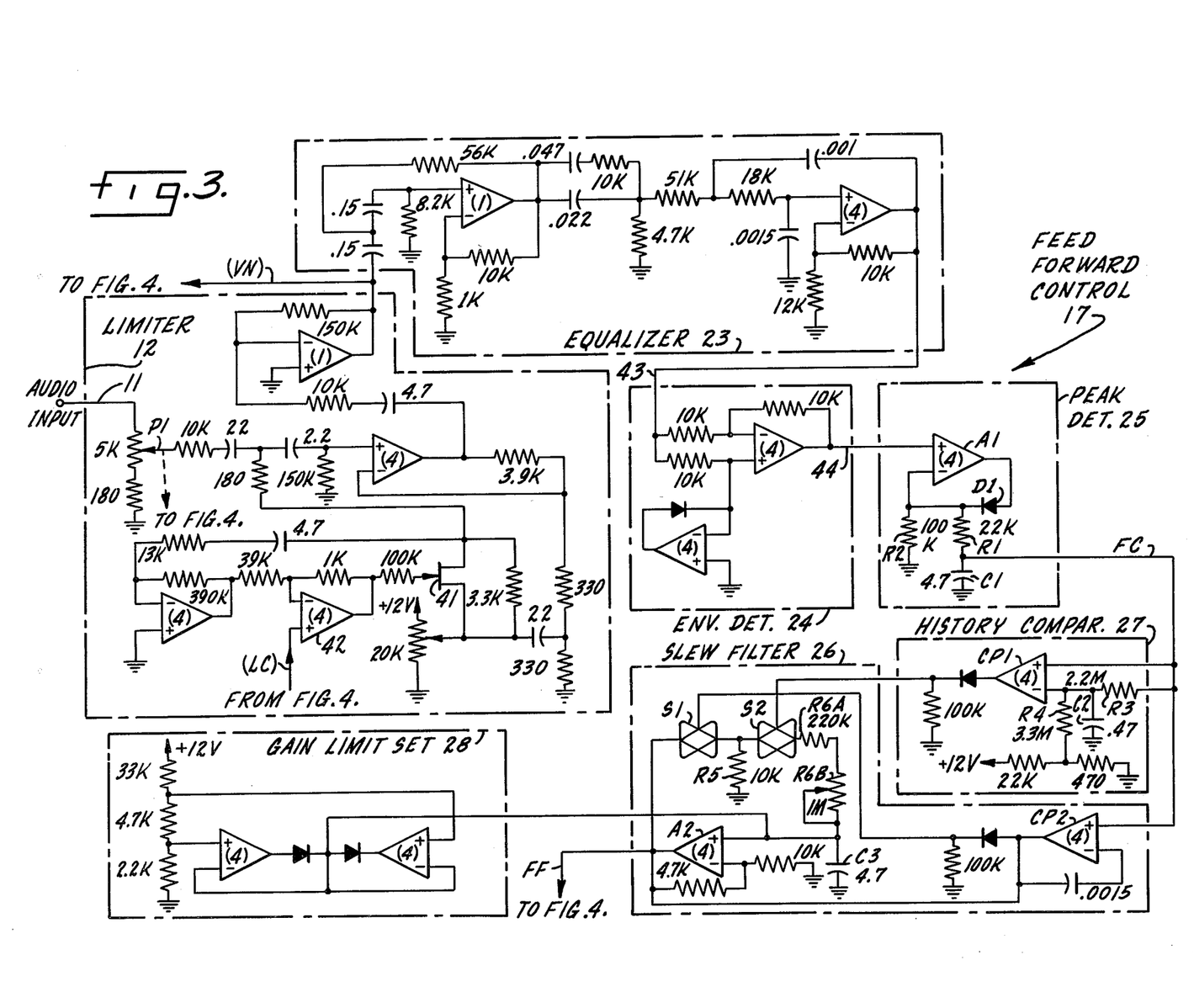
FIGS. 3 and 4 are detail circuit diagrams for a specific embodiment of the circuit of FIG. 1.
Figure 4:
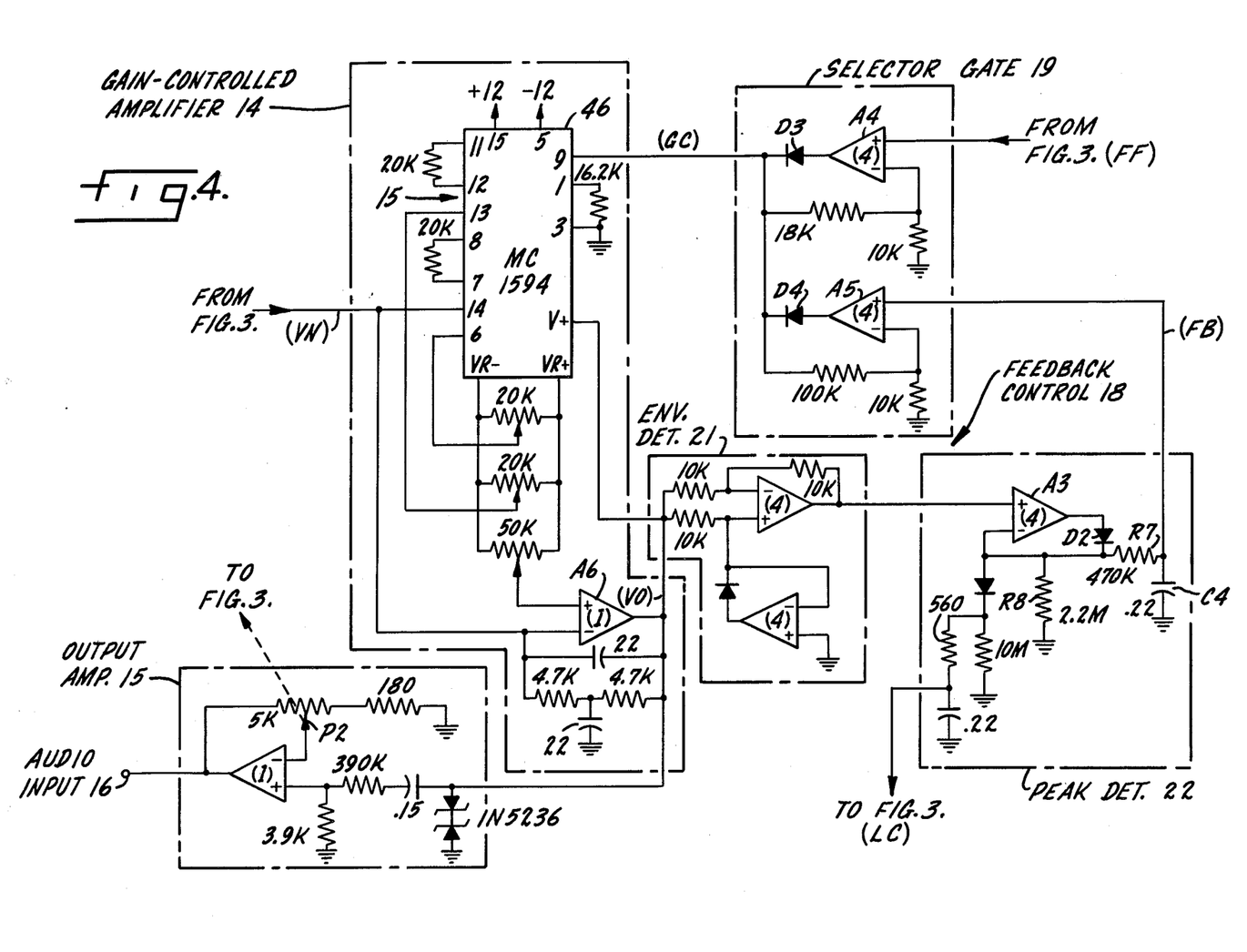

FIGS. 3 and 4 together afford a detailed schematic diagram for the operating circuits of a preferred embodiment of audio loudness control system 10 of FIG. 1. FIG. 3 includes specific circuits for the over-range limiter 12 and the complete feed forward control 17 including equalizer 23, envelope detector 24, peak detector 25, history comparator 27, slew filter 26, and gain limit set circuit 28. FIG. 4, on the other hand, shows specific circuits for gain-controlled amplifier 14, output amplifier 15, the envelope detector 21 and peak detector 22 that constitute feedback control 18, and selector gate 19. In each of these figures, specific values are given for all capacitors and resistors. All diodes are Type 1N4148 unless otherwise designated. Operational amplifiers identified by the symbol (1) are Type 4741 and those identified by the symbol (4) are Type TL074. The analog switches S1 and S1 in slew filter 26 are Type 4016.

In FIG. 3, the over-range limiter circuit 12 is a generally conventional attenuator in which the attenuation level is controlled by an FET 41. To avoid distortion that might be created because the FET is closer to turning on for negative peaks in the audio input signal than for positive peaks, AC feedback is supplied to the gate electrode of the FET. This maintains the resistance in the control channel of the limiter much more constant during the input cycle than would otherwise be the case. In limiter 12, the AC signal is also supplied to the source electrode of the FET, with the result that there is hardly any voltage difference anywhere on the FET, reducing distortion to a minimum. The limiting level for circuit 12 (see characteristic 37 in FIG. 2) is determined by a feedback signal LC derived from the feedback peak detector 22 (FIG. 4) and applied to the operational amplifier 42 connected to the gate electrode of the FET.

Limiter 12, in FIG. 3, is shown as including an input level adjustment potentiometer P1 that is mechanically ganged to a similar potentiometer P2 in output amplifier 15, FIG. 4. This arrangement is utilized to allow for adjustment of the input signal level of system 10 while maintaining constant overall gain in the system.

The circuit shown in FIG. 3 for the seventy phon filter, equalizer 23, is essentially conventional. Equalizer 23 affords an operating characteristic that rises relatively rapidly from very low frequencies up to about 100 Hz, with a more gradual increase up to about 2000 Hz and a relatively rapid decline from about 5000 Hz, simulating the frequency response of the human ear. As previously noted, the output of equalizer 23, on line 43, constitutes an equalized audio signal that is detected in envelope detector 24 to develop, on line 44, a DC signal essentially proportional to loudness.

Peak detector 25, as shown in FIG. 3, comprises an operational amplifier A1 with a feedback circuit including a diode D1 and a resistor R2. The loudness signal FC constituting the output from detector 25 is derived from a circuit comprising a resistor R1 and a capacitor C1. With the values given, peak detector 25 has an attack time of one hundred milliseconds and a release time of five hundred milliseconds. Thus, the signal FC exhibits the frequency and time characteristics desired, corresponding to the subjective loudness of the audio onput.

Slew filter 26, in the circuit shown in FIG. 3, constitutes a novel constant logarithmic slew filter formed by a comparator CP2 having its output connected to one input of an amplifier A2. The output of amplifier A2, which constitutes the feedback gain control signal FF, is fed back to another input of the same amplifier through a circuit that includes an electronic switch S1 actuated by the output from comparator CP2. This feedback circuit further comprises resistors R5, R6A and R6B, and a capacitor C3.

Slew filter 26 functions to slew the level of its output signal FF up and down at a rate determined by the time constant of the series resistors R6A and R6B and the capacitor C3. The slew direction is determined by comparator CP2, based on its input FC. When the voltage on capacitor C3 exceeds that on capacitor C1 (the level of signal FC) comparator CP2 opens switch S1, thereby allowing exponential decay of any charge on capacitor C3 through resistors R6B, R6A, and R5, assuming switch S2 to be closed. On the other hand, if the loudness level indicated by the charge on capacitor C1 exceeds the control voltage on capacitor C3, comparator CP2 closes switch S1 and amplifier A2 applies a voltage to capacitor C3 through series resistors R6A and R6B so that capacitor C3 is charged exponentially. The gain of amplifier A2 is preferably approximately equal to two, so that the decay rate for capacitor C3 is essentially equal to the charge rate and both proceed in accordance with the same exponential (logarithmic) characteristic. This allows slew filter 26 to smooth the functions of the loudness signal at capacitor C1 into a controlled rate of change signal at capacitor C3. Use of a logarithmic rate of change allows for rapid update without needless hunting in the control voltage FF, with a subjectively smooth gain control because the human ear responds logarithmically to loudness changes.

If the gain of amplifier A2 is made greater or less than two, charge rate of capacitor C3 will exceed or be less than the decay rate. Thus, adjustment of the amplifier gain can be made to modify the operating characteristic of slew filter 26, as by providing a more rapid attack to high gain for system 10 for "soft" talkers without a correspondingly fast attack to low gain for loud talkers.

The history comparator or activity gate circuit 27 controls a switch S2 in slew filter 26. In the circuit arrangement of FIG. 3, circuit 27 comprises an operational amplifier CP1 functioning as a comparator with one direct input constituting the loudness signal FC and the other input derived from the loudness signal FC through a circuit comprising a series resistor R3, a shunt capacitor C2 and a shunt resistor R4 that is connected to a fixed threshold voltage. Resistor R3 and capacitor C2 have values selected to average the input signal FC; an appropriate time constant is one second. For comparator CP1 to supply an output signal to switch S2 that will close that switch, the voltage on capacitor C1 in peak detector 25, representative of subjective loudness, must be greater than the threshold set by the reference voltage to which the comparator is connected through resistor R4. This prevents small noises unrelated to actual audio or other program information from being sampled into the control voltage FF by slew filter 26. Furthermore, to close switch S2 the signal FC must be greater than a fraction, determined by resistors R4 and R3, of the recent (one second) average for the loudness signal. This forces peak loudness values to be sampled into the feed forward control voltage FF. For a brief interruption in audio signal input, history comparator circuit 27 maintains switch S2 open, precluding any substantial change in the charge on capacitor C3, the basic determinate of forward feed gain control signal FF.

Gain limit set circuit 28, as shown in FIG. 3, is basically a clamp circuit for capacitor C3. It sets both upper and lower threshold levels for the voltage on capacitor C3 and thus determines the operational thresholds for the system.

As shown in FIG. 4, the envelope detector 21 in feedback control 18 may utilize the same circuit as envelope detector 24 in feed forward control 17 (FIG. 3). The audio output signal VO is rectified in detector 21 and supplied to peak detector 22, which comprises an amplifier A3, a diode D2, the resistors R7 and R8, and a capacitor C4. Peak detector 21, like detector 25, has an attack time of one hundred milliseconds and a release time of five hundred milliseconds to simulate the growth and decay in subjective loudness of signal VO.

The feedback gain control signal FB, derived from the charge on capacitor C4, is supplied as one input to selector gate 19. The other input to gate 19 is the feed forward gain control signal FF from slew filter 26 (FIG. 3). Gate 19 includes an operational amplifier A4 and a diode D3 which, in combination, afford an ideal diode action. The combination of an operational amplifier A5 and a diode D4 serves the same purpose. In gate 19 whenever the feed forward signal FF exceeds the feedback signal FB, the output signal GC is the signal FF because diode D4 is driven nonconductive. Similarly, if signal FB exceeds signal FF, then diode D3 is driven nonconductive and the output signal GC is the feedback gain control signal FB. Thus, gate 19 applies the larger control voltage to gain-controlled amplifier 14 and can instantly change between feed forward and feedback control with each control mode remaining independent of the other.

The preferred form of gain-controlled amplifier 14 shown in FIG. 4 comprises an analog multiplier circuit 46 connected in a feedback circuit for an operational amplifier A6. Multiplier 46 functions in a manner analogous to a voltage-controlled resistor having a variable resistance value that determines the gain of amplifier A6. An increase in the DC gain control voltage GC supplied to multiplier 46 results in an increase in the feedback signal to amplifier A6, corresponding to a decrease in the effective resistance in the feedback circuit provided by multiplier 46 so that the result is a decrease in gain of amplifier A6. Conversely, a reduction in the gain control signal GC causes an increase in the gain of amplifier A6. With the illustrated circuit, amplifier 14 has an operating characteristic such that a one dB increase in the gain control voltage GC results in a one dB reduction in gain for the amplifier. It will be recognized that other forms of gain-controlled amplifier could be used for circuit 14, but the illustrated circuit has been found satisfactory.

We claim:

1. An audio loudness control system for use with a broad dynamic range of audio input signals comprising:
   a gain-controlled audio amplifier having an audio signal input, a gain control input, and an audio signal output;
   feed forward control signal generator means, having an input coupled to the audio signal input of the amplifier, for generating a feed forward control signal representative of excursions of the average audio input signal above a predetermined loudness threshold;
   feedback control signal generator means, having an input coupled to the audio signal output of the amplifier, for generating a feedback control signal representative of transient excursions of the audio output signal above the predetermined loudness threshold;
   and selector gate means, having inputs coupled to the feed forward and feedback control signal generator means and an output coupled to the gain control input of the amplifier, for selecting the control signal instantaneously representative of the larger excursion above the loudness threshold and applying the selected control signal to the gain control input of the amplifier.

2. A gain-controlled audio amplifier system according to claim 1 in which each of the control signal generator means comprises an envelope detector connected in series with a peak detector, the peak detector having a release time substantially longer than its attack time.

3. A gain-controlled audio amplifier system according to claim 2 in which the peak detector has an attack time of the order of one hundred milliseconds and a release time of the order of five hundred milliseconds.

4. A gain-controlled audio amplifier system according to claim 1 in which the feed forward control signal generator comprises:
   equalizer means for weighting the audio input signal approximately in accordance with the frequency sensitivity characteristics of the human ear to develop an equalized audio signal;
   detector means for detecting the equalized audio signal to develop a loudness signal; and
   filter means for smoothing fluctuations of the loudness signal in accordance with a predetermined rate of change characteristic to develop the feed forward control signal.

5. An audio loudness control system according to claim 4 in which the detector means comprises an envelope detector connected in series with a peak detector, the peak detector having a release time substantially longer than its attack time.

6. An audio loudness control system according to claim 4 in which the filter means has an exponential rate of change characteristic.

7. An audio loudness control system according to claim 4 in which the filter means is a constant logarithmic slew filter, so that any increase or decrease in the feed forward control signal occurs at a logarithmic slew rate.

8. An audio loudness control system according to claim 7 in which the detector means comprises an envelope detector connected in series with a peak detector, the peak detector having a release time substantially longer than its attack time.

9. An audio loudness control system according to claim 7 in which the constant logarithmic slew filter comprises:
- a capacitor, the feed forward control signal being determined by the charge on the capacitor;
- an amplifier having an input from the capacitor;
- a charging circuit for the capacitor comprising the series combination of a signal-actuated switch and a charging resistance connected from the amplifier output to the capacitor;
- a discharging circuit for the capacitor comprising the charging resistance and an additional discharge resistance returned to system ground;
- and a comparator for comparing the loudness signal with the feed forward control signal, the comparator having an output connected to the signal-actuated switch effective to close the switch and charge the capacitor when the loudness signal exceeds the feed forward control signal and to open the switch and discharge the capacitor when the feed forward control signal exceeds the loudness signal.

10. An audio loudness control system according to claim 9 in which the gain of the slew filter amplifier is approximately two.

11. An audio loudness control system according to claim 9 in which the detector means comprises an envelope detector connected in series with a peak detector, the peak detector having a release time substantially longer than its attack time.

12. An audio loudness control system according to claim 4 in which the feed forward control signal generator further comprises history comparator means, having an input connected to the detector means and an output connected to the filter means, to preclude appreciable change in the feed forward control signal responsive to transient changes in the loudness signal.

13. An audio loudness control system according to claim 12 in which the filter means is a constant logarithmic slew filter that comprises:
- a capacitor, the feed forward control signal being determined by the charge on the capacitor;
- an amplifier having an input from the capacitor;
- a charging circuit for the capacitor comprising the series combination of a signal-actuated switch and a charging resistance connected from the amplifier output to the capacitor;
- a discharging circuit for the capacitor comprising the charging resistance and an additional discharge resistance returned to system ground;
- a comparator for comparing the loudness signal with the feed forward control signal, the comparator having an output connected to the signal-actuated switch effective to close the switch and charge the capacitor when the loudness signal exceeds the feed forward control signal and to open the switch and discharge the capacitor when the feed forward control signal exceeds the loudness signal;
- and a second signal-actuated switch connected in series in the charging-discharging circuit for the capacitor, between the charging resistance and the discharging resistance;
- the output of the history comparator means being connected to the second switch in the slew filter.

14. An audio loudness control system according to claim 1, in which the feed forward control means comprises:
- equalizer and detector means for generating a loudness signal representative of the subjective loudness of the audio input signal;
- a constant logarithmic slew filter for smoothing fluctuations of the loudness in accordance with a logarithmic slew rate to develop the feed forward control signal, the slew filter including:
  - a capacitor, the feed forward control signal being determined by the charge on the capacitor;
  - an amplifier having an input from the capacitor;
  - a charging circuit for the capacitor comprising the series combination of a signal-actuated switch and a charging resistance connected from the amplifier output to the capacitor;
  - a discharging circuit for the capacitor comprising the charging resistance and an additional discharge resistance returned to system ground;
  - and a comparator for comparing the loudness signal with the feed forward control signal, the comparator having an output connected to the signal-actuated switch effective to close the switch and charge the capacitor when the loudness signal exceeds the feed forward control signal and to open the switch and discharge the capacitor when the feed forward control signal exceeds the loudness signal;
- and gain limit set circuit means, coupled to the slew filter, for limiting discharge of the capacitor to a given minimum value to establish the loudness threshold for the system.

15. An audio loudness control system according to claim 14 in which the gain limit set circuit means further limits the charge on the capacitor to a given maximum value.

16. An audio loudness control system according to claim 14 in which the feed forward control signal generator further comprises history comparator means, having an input connected to the equalizer and detector means and an output connected to the slew filter, to preclude appreciable change in the feed forward control signal responsive to transient changes in the loudness signal.

17. An audio loudness control system according to claim 16 in which the slew filter further comprises a second signal-actuated switch connected in series in the charging-discharging circuit for the capacitor, between the charging resistance and the discharging resistance, and in which the output of the history comparator means is connected to the second switch in the slew filter.

18. An audio loudness control system according to claim 17 in which the equalizer and detector means in the feed forward control means comprises:
- a seventy phon filter, employed as an equalizer for weighting the audio input signal approximately in accordance with the frequency sensitivity characteristics of the human ear to develop an equalized audio signal; and
- detector means for detecting the equalized audio signal to generate the loudness signal, the detector means comprising an envelope detector connected in series with a peak detector, the peak detector having a release time substantially longer than its attack time.

19. An audio loudness control system according to claim 18 in which the gain limit set circuit means further limits the charge on the capacitor to a given maximum value.

20. An audio loudness control system according to claim 19 in which the feedback control signal generator comprises an envelope detector connected in series with a peak detector, the peak detector having a release time substantially longer than its attack time.

21. An audio loudness control system according to claim 20, and further comprising:
- over-range limiter means comprising a signal-actuated attenuator, interposed in the system input ahead of the gain-controlled audio amplifier and the feed forward control signal generator means effective to limit the amplitude of the audio input signal;
- and a feedback circuit connecting the feedback control signal generator to the over-range limiter means.

* * * * *